United States Patent
Itou

(10) Patent No.: US 10,319,501 B2
(45) Date of Patent: Jun. 11, 2019

(54) CHIP RESISTOR

(71) Applicant: Panasonic Intellectual Property Management Co., Ltd., Osaka (JP)

(72) Inventor: Masaaki Itou, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/107,079

(22) PCT Filed: Feb. 2, 2015

(86) PCT No.: PCT/JP2015/000439
§ 371 (c)(1),
(2) Date: Jun. 21, 2016

(87) PCT Pub. No.: WO2015/129161
PCT Pub. Date: Sep. 3, 2015

(65) Prior Publication Data
US 2016/0343479 A1    Nov. 24, 2016

(30) Foreign Application Priority Data
Feb. 27, 2014   (JP) ................................ 2014-036322

(51) Int. Cl.
*H01C 1/08*   (2006.01)
*H01C 1/084*  (2006.01)
(Continued)

(52) U.S. Cl.
CPC ............ *H01C 1/084* (2013.01); *G01R 1/203* (2013.01); *H01C 1/028* (2013.01); *H01C 7/003* (2013.01); *H01C 7/06* (2013.01); *H01C 1/14* (2013.01)

(58) Field of Classification Search
CPC . H01C 1/084; H01C 1/08; H01C 7/02; H01C 7/00
(Continued)

(56) References Cited

U.S. PATENT DOCUMENTS 4,931,626 A * 6/1990 Shikama .................. H05B 3/14
                                                    165/96
2004/0233032 A1* 11/2004 Schneekloth .......... H01C 1/084
                                                     338/7
(Continued)

FOREIGN PATENT DOCUMENTS

| CN | 1823395 A | 8/2006 |
| CN | 102024538 A | 4/2011 |

(Continued)

OTHER PUBLICATIONS

International Search Report of PCT application No. PCT/JP2015/000439 dated Apr. 21, 2015.
(Continued)

*Primary Examiner* — Kyung S Lee
*Assistant Examiner* — Iman Malakooti
(74) *Attorney, Agent, or Firm* — McDermott Will & Emery LLP

(57) ABSTRACT

A chip resistor includes a resistive element, a pair of electrodes, and heat radiator plates. The resistive element is made of a plate-shaped metal. The pair of electrodes is formed on both ends of a first surface of the resistive element. The heat radiator plates are fastened to a second surface of the resistive element and are disposed spaced apart from each other via a gap therebetween.

8 Claims, 5 Drawing Sheets

(51) Int. Cl.
  *G01R 1/20* (2006.01)
  *H01C 1/028* (2006.01)
  *H01C 7/00* (2006.01)
  *H01C 7/06* (2006.01)
  *H01C 1/14* (2006.01)

(58) Field of Classification Search
  USPC .................................................. 338/51, 309
  See application file for complete search history.

(56) References Cited

U.S. PATENT DOCUMENTS

| | | | | |
|---|---|---|---|---|
| 2007/0262845 | A1* | 11/2007 | Takagi | H01C 1/08 338/51 |
| 2009/0160602 | A1* | 6/2009 | Tsukada | H01C 1/084 338/309 |
| 2013/0025915 | A1* | 1/2013 | Lin | B32B 37/02 174/254 |
| 2013/0341301 | A1* | 12/2013 | Chen | H01C 7/00 216/20 |

FOREIGN PATENT DOCUMENTS

| | | | | |
|---|---|---|---|---|
| JP | 05-175001 | * | 7/1993 | ............. H01C 1/084 |
| JP | 5-175001 | | 7/1993 | |
| JP | 5-175001 A | | 7/1993 | |
| JP | 06-302405 | * | 10/1994 | ............... H01C 7/02 |
| JP | 6-302405 | | 10/1994 | |
| JP | 6-302405 A | | 10/1994 | |
| JP | 2000-091103 | * | 3/2000 | ............... H01C 7/00 |
| JP | 2000-277301 | | 10/2000 | |
| JP | 2006-332413 | | 12/2006 | |
| JP | 2008-053255 | | 3/2008 | |
| JP | 2014-007374 | | 1/2014 | |
| WO | 2007/020802 | | 2/2007 | |

OTHER PUBLICATIONS

English Translation of Chinese Search Report dated Oct. 31, 2017 for the related Chinese Patent Application No. 201580003399.1.
English Translation of Chinese Search Report dated May 3, 2018 for the related Chinese Patent Application No. 201580003399.1.

* cited by examiner

US 10,319,501 B2

CHIP RESISTOR

CROSS-REFERENCE TO RELATED APPLICATIONS

This application is a U.S. national stage application of the PCT International Application No. PCT/JP2015/000439 filed on Feb. 2, 2015, which claims the benefit of foreign priority of Japanese patent application 2014-036322 filed on Feb. 27, 2014, the contents all of which are incorporated herein by reference.

TECHNICAL FIELD

The present invention relates to a chip resistor for high-power application used for detecting current values, for example, of various types of electronic devices.

BACKGROUND ART

FIG. 13 is a sectional view of a conventional chip resistor. The chip resistor includes resistive element 1 of a plate-shaped metal, a pair of electrodes 4, protective film 3, and heat radiator plate 5. Each of electrodes 4 has conductor part 4A and plated layer 4B formed so as to cover conductor part 4A. Electrodes 4 are formed on both ends of a first surface of resistive element 1. Protective film 3 is formed between the pair of electrodes 4. Heat radiator plate 5 is made of epoxy resin, has a planar shape same as that of resistive element 1, and is stuck to a second surface of resistive element 1 (e.g., PTL 1).

CITATION LIST

Patent Literature

PTL 1: Japanese Patent Unexamined Publication No. 2006-332413

SUMMARY OF THE INVENTION

A first chip resistor of the present invention includes a resistive element, a pair of electrodes, and multiple heat radiator plates. The resistive element is formed of a plate-shaped metal, and the pair of electrodes is formed on both ends of a first surface of the resistive element. The heat radiator plates are fastened to the second surface of the resistive element and are apart from each other via a gap therebetween.

A second chip resistor of the present invention includes a resistive element, a pair of electrodes, and a heat radiator plate. The resistive element is a plate-shaped metal and has a trimming groove formed therein. The pair of electrodes is formed on both ends of a first surface of the resistive element. The heat radiator plate is fastened to a second surface of the resistive element and covers at least a part where the trimming groove is formed.

Either one of the above configurations provides a chip resistor of the present invention with a long-term reliability.

DESCRIPTION OF EMBODIMENTS

Figure 13:
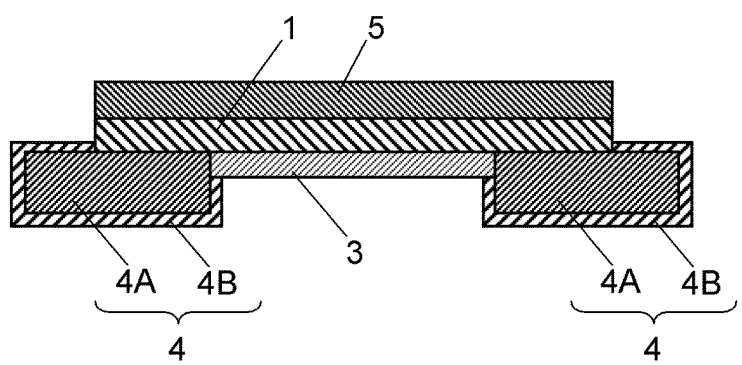
FIG. 13 is a sectional view of a conventional chip resistor.

Prior to the description of embodiments of the present invention, a description is made of some disadvantages of the conventional chip resistor illustrated in reference to FIG. 13. For this chip resistor with a small size to achieve a relatively high resistance value (approximately between 20 mΩ and 50 mΩ), resistive element 1 needs to be thin. However, thin resistive element 1 generates a large amount of heat. Especially when used for high-power application, the temperature of resistive element 1 becomes greatly high. Resistive element 1 has a thermal expansion coefficient different from that of heat radiator plate 5, which causes a stress between them when used for a long term. This sometimes produces a crack between them, thus decreasing the long-term reliability.

Hereinafter, a description is made of a chip resistor according to embodiments of the present invention that provides a long-term reliability, with reference to the related drawings. A component having the same configuration as that of the preceding embodiments is given the same reference mark, and its description may be omitted.

First Exemplary Embodiment

Figure 1A:
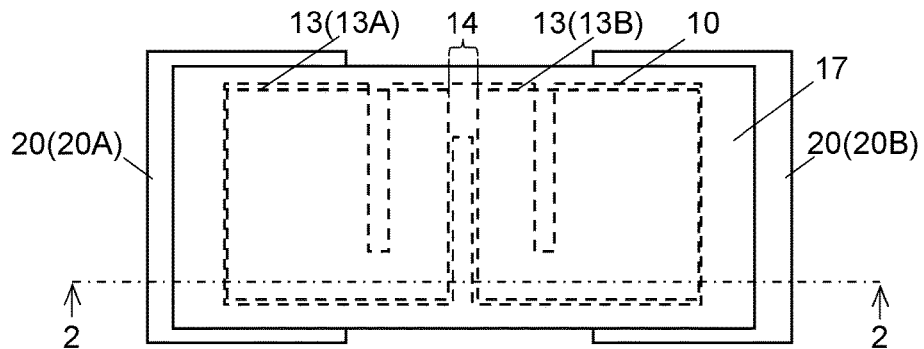
FIG. 1A is a plan view of a chip resistor according to a first exemplary embodiment of the present invention.
Figure 1B:
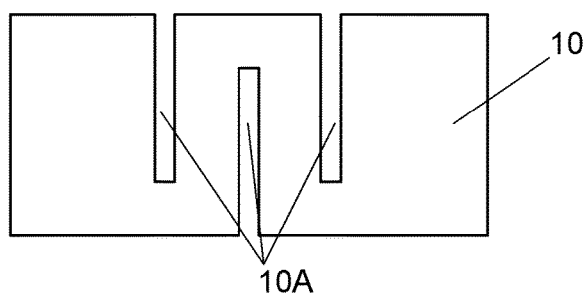
FIG. 1B is a plan view of a resistive element of the chip resistor shown in FIG. 1A.
Figure 1C:
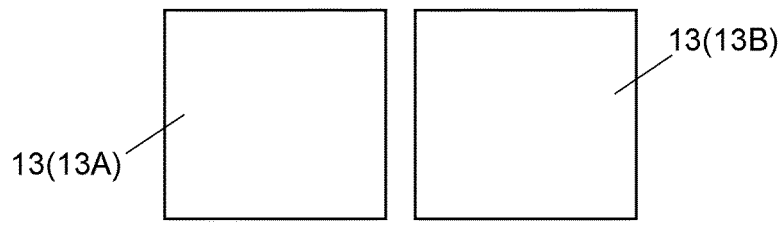
FIG. 1C is a plan view of a heat radiator plate of the chip resistor shown in FIG. 1A.
Figure 2:
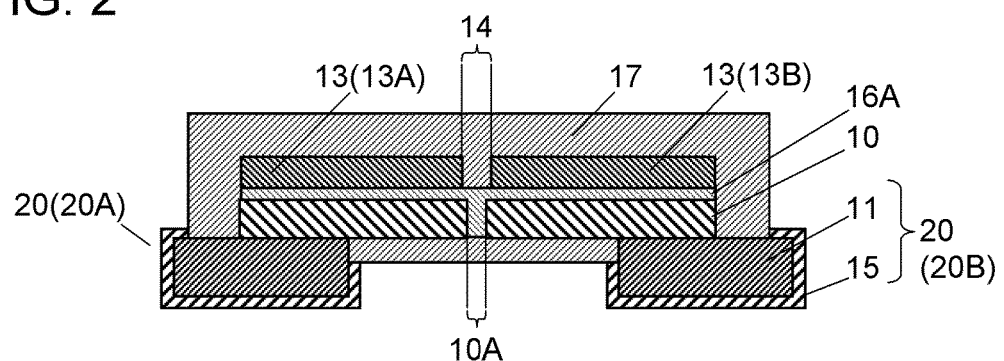
FIG. 2 is a sectional view of the chip resistor shown in FIG. 1A.

FIG. 1A is a plan view of a chip resistor according to the first exemplary embodiment of the present invention. FIGS. 1B and 1C are respectively a plan view of resistive element 10 and a plan view of multiple heat radiator plates 13 of the chip resistor. FIG. 2 is a sectional view of the chip resistor, taken along line 2-2.

The chip resistor has resistive element 10, a pair of electrodes 20, and multiple heat radiator plates 13. Resistive element 10 is made of a plate-shaped metal. The pair of electrodes 20 is formed on both ends of the first surface of resistive element 10. Multiple heat radiator plates 13 are fastened to the second surface of resistive element 10 and are disposed spaced apart from each other through gap 14.

Resistive element 10 is made of a plate-shaped metal such as CuNi, CuMn, and NiCr. Resistive element 10 is provided with one or more trimming grooves 10A by punching, for example. The resistance value of resistive element 10 is adjusted by forming trimming grooves 10A.

Each of the pair of electrodes 20 has metal plate 11 and plated layer 15. Metal plate 11 primarily contains Cu and is welded to resistive element 10. Plated layer 15 for implementation is formed around metal plate 11. Plated layer 15 is formed of nickel plating, tin plating, or the like. The pair of electrodes 20 is composed of first electrode 20A and second electrode 20B.

Heat radiator plates 13 are plate-shaped components made of highly thermally conductive ceramics such as alumina. Heat radiator plates 13 are stuck to the second surface of resistive element 10 through adhesive layer 16A. Note that heat radiator plates 13 may be formed of a highly thermally conductive metal such as copper and aluminum; heat radiator plates 13 is preferably formed of ceramics from the aspect of insulation.

Heat radiator plates 13 include first heat radiator plate 13A closest to first electrode 20A and second heat radiator plate 13B closest to second electrode 20B. First heat radiator plate 13A and second heat radiator plate 13B are disposed spaced apart from each other through a given gap. Further, the longitudinal direction of gap 14 between first heat radiator plate 13A and second heat radiator plate 13B is orthogonal to the direction in which first electrode 20A and second electrode 20B face (or oppose) each other. In the example shown in FIG. 1A, trimming groove 10A overlaps with gap 14 in a planar view.

FIGS. 1A through 2 show only first heat radiator plate 13A and second heat radiator plate 13B as multiple heat radiator plates 13; however, other heat radiator plates may be disposed. In other words, the number of heat radiator plates 13 is not limited to two, but three or more heat radiator plates 13 may be provided.

Adhesive layer 16A is formed by applying an epoxy adhesive onto heat radiator plate 13 and/or resistive element 10 and then drying the adhesive. Heat radiator plate 13 and resistive element 10 are stuck to each other through adhesive layer 16A. Further, mixing highly thermally conductive, powdered alumina or silica into adhesive layer 16A allows heat generated in resistive element 10 to efficiently dissipate.

After the epoxy adhesive is applied onto the entire surface of resistive element 10, multiple heat radiator plates 13 are placed at given positions of resistive element 10 and bonded to resistive element 10 there. Alternatively, after adhesive layer 16A is applied to each of multiple heat radiator plates 13, they may be placed at given positions of resistive element 10 and bonded to resistive element 10 there. Further alternatively, after adhesive layer 16A is applied to resistive element 10 and one heat radiator plate is bonded to the entire surface of resistive element 10, the heat radiator plate can be divided to form gap 14. This manner, however, can unfavorably scratch resistive element 10 when gap 14 is formed.

Further, epoxy resin or silicon resin is applied so as to cover the top surfaces of parts of the pair of electrodes 20 and heat radiator plate 13, and the side surfaces of resistive element 10 and heat radiator plates 13, and then the resin is dried to form protective film 17. Protective film 17 contains linear silica powder therein, thereby increasing heat conduction of protective film 17. FIG. 1A, with protective film 17 being transparent, shows resistive element 10 and heat radiator plate 13 by broken lines.

In the chip resistor according to the present embodiment, heat radiator plates 13 made of metal or ceramics are fastened to resistive element 10. Accordingly, heat generated in resistive element 10 can be diffused to the pair of electrodes 20 as well as to heat radiator plates 13. The heat generated in resistive element 10 transmits to heat radiator plates 13 and protective film 17, which increases the heat capacity. This suppresses the temperature rise of the hot spot of resistive element 10, which increases the long-term reliability.

Multiple heat radiator plates 13 are disposed spaced apart from each other through gap 14. Accordingly, even if resistive element 10 and each of heat radiator plates 13 have thermal expansion coefficients different from each other, a stress produced between resistive element 10 and each of heat radiator plates 13 can be reduced. This suppresses a crack from being produced between them.

For example, if the thermal expansion coefficient of heat radiator plate 13 is larger than that of resistive element 10, heat generated in resistive element 10 causes resistive element 10 to be pulled toward heat radiator plate 13, and a force is exerted so as to extend the resistive element toward the outside along the surface where the resistive element contacts the heat radiator plate. In a case where the heat radiator plate has the same planar shape as that of the resistive element like the conventional structure, this force is exerted to a large degree, which generates a strong stress between resistive element 10 and heat radiator plate 13.

Meanwhile, in this embodiment, multiple heat radiator plates 13 are disposed spaced apart from each other through a given gap. Accordingly, the extension force is exerted on resistive element 10 toward the outside along the surface where resistive element 10 contacts heat radiator plate 13 as well as toward the inside where gap 14 is positioned. Hence, the overall force to extend the resistive element decreases, and a stress generated between resistive element 10 and heat radiator plate 13 decreases. It is thus greatly effective to dispose multiple heat radiator plates 13 in such a manner and to use gap 14 between heat radiator plates 13 as a relief part.

Further, if first electrode 20A is assumed to be positive, to which a current flows in; second electrode 20B is assumed to be negative, from which a current flows out, it is preferable that the heat conductivity of second heat radiator plate 13B is lower than that of first heat radiator plate 13A. Reversely, if second electrode 20B is assumed to be positive, to which a current flows in; first electrode 20A is assumed to be negative, from which a current flows out, it is preferable that the heat conductivity of first heat radiator plate 13A is lower than that of second heat radiator plate 13B. That is, second heat radiator plate 13B preferably has a heat conductivity different from that of first heat radiator plate 13A. In this way, even if a temperature difference occurs between the positive and the negative electrodes due to the Peltier effect, the temperature difference between the pair of electrodes 20 is reduced, which prevents long-term deterioration of plated layer 15 due to a high temperature of one of the electrodes.

Alumina with a higher purity has a higher heat conductivity. Thus, to make the heat conductivity of first heat radiator plate 13A different from that of second heat radiator plate 13B, it is appropriate to form first heat radiator plate 13A and second heat radiator plate 13B from alumina with different purities, for example.

It is preferable to roughen each of heat radiator plates 13 at a surface thereof facing resistive element 10 by sandblasting, for example, which increases the adhesion between each of heat radiator plates 13 and resistive element 10. Accordingly, heat generated in resistive element 10 transfers to heat radiator plates 13 more easily, which suppresses the temperature rise of resistive element 10 more efficiently. Meanwhile, roughening each of heat radiator plates 13 at a surface thereof opposite to resistive element 10 enlarges its surface area to increase the heat dissipation.

Figure 3:
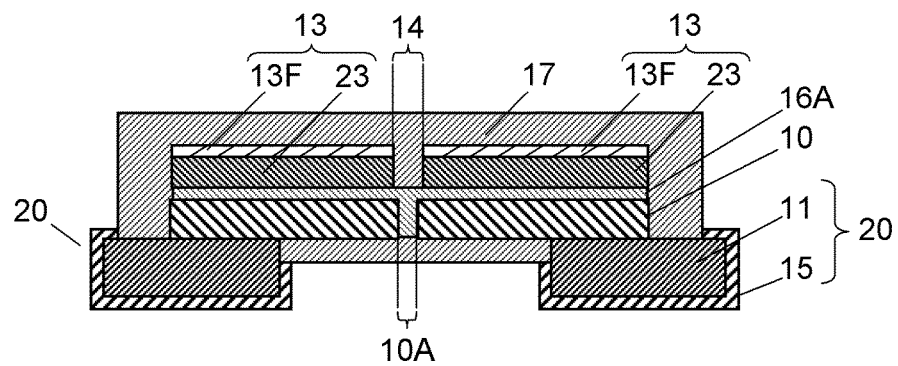
FIG. 3 is a sectional view of another chip resistor according to the first embodiment of the present invention.

Next, a description is made of a preferable structure of heat radiator plates 13 referring to FIG. 3. FIG. 3 is a sectional view of another chip resistor according to the present embodiment. In this chip resistor, each of heat radiator plates 13 has ceramic plate 23 and metal layer 13F. Ceramic plate 23 has a first surface stuck onto the second surface of resistive element 10; and a second surface opposite to the first surface. Metal layer 13F is formed on the second surface of ceramic plate 23. Using ceramic plate 23 further increases the heat dissipation of heat radiator plate 13, so does the heat dissipation from metal layer 13F to protective film 17, which further suppresses the temperature rise of resistive element 10.

Figure 4:
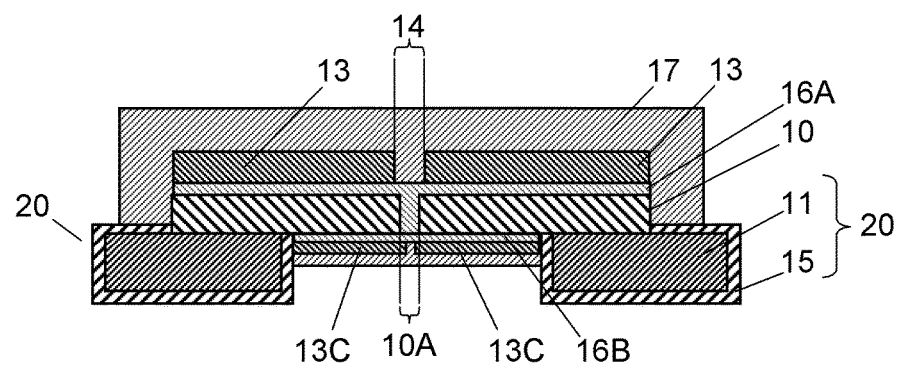
FIG. 4 is a sectional view of still another chip resistor according to the first embodiment of the present invention.

Next, a description is made of a structure with additional heat radiator plates referring to FIG. 4. FIG. 4 is a sectional view of still another chip resistor according to the present embodiment. The chip resistor has additional heat radiator plates 13C on the first surface where the pair of electrodes 20 of resistive element 10 is formed. These plates contribute to dissipate heat from the first surface of resistive element 10, which further suppresses the temperature rise of resistive element 10.

In the above description, the longitudinal direction of gap 14 agrees with a direction orthogonal to the direction in which each of the pair of electrodes 20 faces the other. However, the invention is not limited to this configuration, but the longitudinal direction of gap 14 may be oblique or parallel with the direction in which each of the pair of electrodes 20 faces the other. This increases the strength against a flexural stress of resistive element 10.

Alternatively, gap 14 may be disposed in a zigzag fashion. Specifically, two heat radiator plates 13 are formed in a comb-teeth shape, where parts projecting to and recessed from the opposite heat radiator plate 13 are alternately formed and fit with each other.

Second Exemplary Embodiment

Figure 5:
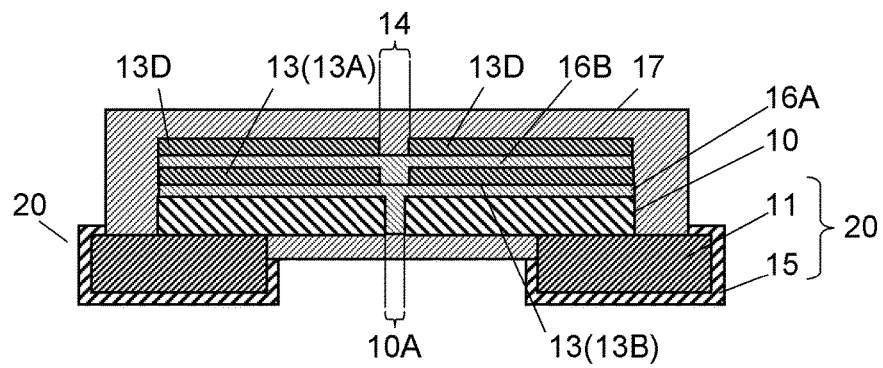
FIG. 5 is a sectional view of a chip resistor according to a second exemplary embodiment of the present invention.

FIG. 5 is a sectional view of a chip resistor according to the second exemplary embodiment of the present invention. This embodiment is different from the first embodiment in that multiple heat radiator plates are laminated. In the configuration shown in FIG. 5, upper-layer heat radiator plate 13D is laminated on each of two heat radiator plates 13 via adhesive layer 16B therebetween. The configuration of adhesive layer 16B is the same as that of adhesive layer 16A. Upper-layer heat radiator plate 13D laminated on first heat radiator plate 13A is a third heat radiator plate; upper-layer heat radiator plate 13D laminated on second heat radiator plate 13B is a fourth heat radiator plate.

This configuration allows the numbers of heat radiator plates 13 and upper-layer heat radiator plates 13D to be changed according to a rated or guaranteed value of current application, and thus the temperature rise of resistive element 10 can be controlled and a product with any rated value can be produced easily.

If heat radiator plate 13 and upper-layer heat radiator plate 13D are made thicker, or if multiple upper-layer heat radiator plates 13D are laminated on respective one of heat radiator plates 13, heat dissipation is increased, it may thus eliminate the need for protective film 17.

In FIG. 5, although two layers (heat radiator plate 13 and upper-layer heat radiator plate 13D) are employed in FIG. 5, three or more layers (a lamination of multiple upper-layer heat radiator plates 13D) may be formed.

Figure 6:
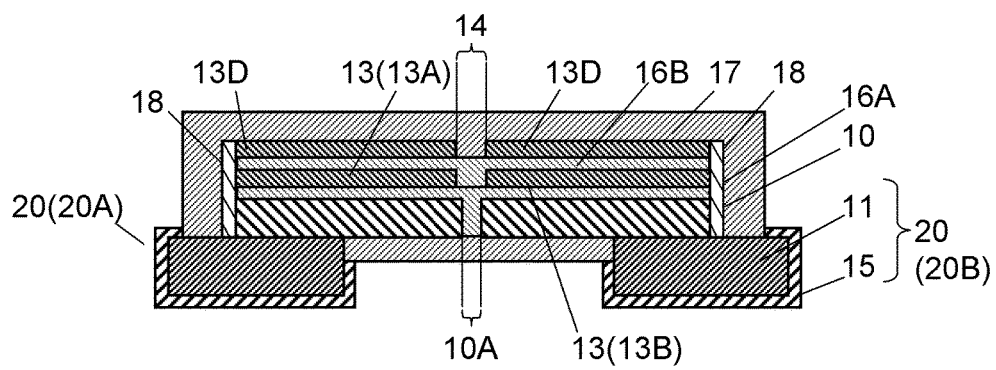
FIG. 6 is a sectional view of another chip resistor according to the second embodiment of the present invention.

Next, a description is made of further preferable structure with upper-layer heat radiator plate 13D with reference to FIG. 6. FIG. 6 is a sectional view of another chip resistor according to the present embodiment.

In this configuration, highly heat-conductive components 18 are disposed on both end surfaces of heat radiator plate 13, upper-layer heat radiator plate 13D, and resistive element 10, respectively, so that heat radiator plate 13, upper-layer heat radiator plate 13D, and a pair of electrodes 20 are thermally coupled to one another. Highly heat-conductive component 18 is formed of a highly heat-conductive metal such as Cu and Ag. Highly heat-conductive component 18 may be connected to not all of laminated heat radiator plate 13 and upper-layer heat radiator plate 13D but parts of them. That is, first electrode 20A is thermally coupled with first heat radiator plate 13A, and second electrode 20B is thermally coupled with second heat radiator plate 13B.

This configuration allows heat generated in resistive element 10 to transmit to the pair of electrodes 20 as well through heat radiator plate 13 and highly heat-conductive component 18. This suppresses the temperature rise of the hot spot of resistive element 10, which further increases the long-term reliability.

Figure 7:
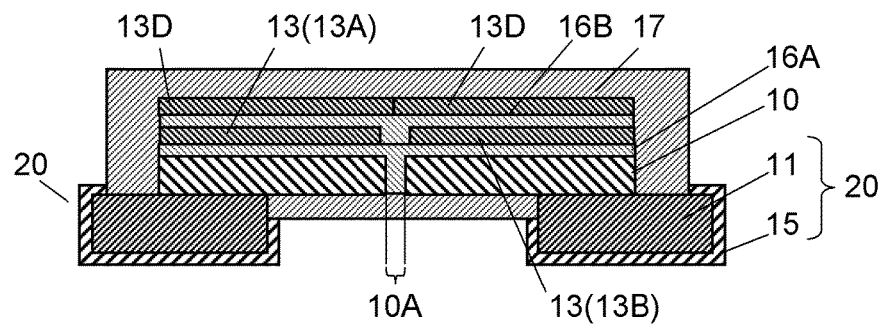
FIG. 7 is a sectional view of still another chip resistor according to the second embodiment of the present invention.
Figure 8:
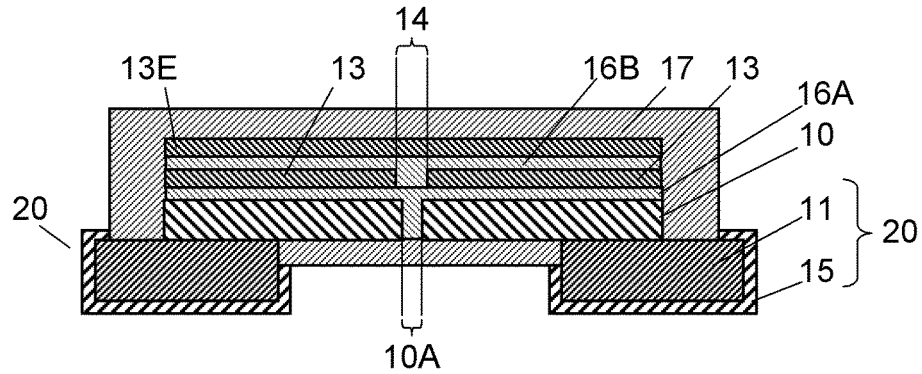
FIG. 8 is a sectional view of yet another chip resistor according to the second embodiment of the present invention.

Further, as shown in FIG. 7, upper-layer heat radiator plates 13D may be disposed in contact with each other without gap 14 therebetween. Upper-layer heat radiator plate 13D laminated on first heat radiator plate 13A is a first upper-layer heat radiator plate, and upper-layer heat radiator plate 13D laminated on second heat radiator plate 13B is a second upper-layer heat radiator plate thermally coupled with the first upper-layer heat radiator plate. Alternatively, as shown in FIG. 8, one upper-layer heat radiator plate 13E may be laminated on multiple heat radiator plates 13.

Heat radiator plate 13 formed of a metal can cause a short circuit due to a short distance between heat radiator plate 13 positioned at the lowest layer and resistive element 10. For this reason, gap 14 needs to be provided between heat radiator plates 13. Meanwhile, upper-layer heat radiator plate 13D is separated from resistive element 10 to some extent, and thus gap 14 does not need to be provided between upper-layer heat radiator plates 13D. Additionally using upper-layer heat radiator plate 13E increases the heat dissipation and the strength of the chip resistor.

In a case where two or more layers of upper-layer heat radiator plates 13D are to be employed, gap 14 may be provided only between heat radiator plates 13 and multiple layers of upper-layer heat radiator plates 13E may be provided according to heat dissipation, strength, and the possibility of a short circuit. Alternatively, upper-layer heat radiator plate 13E may be used only for the top layer and gaps 14 are provided between heat radiator plates 13 and between upper-layer heat radiator plates 13D. Further, upper-layer heat radiator plate 13E may be formed only near a position where much heat is generated or only near a position weak in strength. Upper-layer heat radiator plate 13E may be provided so that its outermost perimeter is inside the outermost perimeter of entire multiple heat radiator plates 13 with gap 14 therebetween in a planar view. If upper-layer heat radiator plates 13D with gap 14 provided therebetween are laminated on heat radiator plates 13 and upper-layer heat radiator plate 13E is additionally laminated on upper-layer heat radiator plates 13D, upper-layer heat radiator plate 13E may be provided so that its outermost perimeter is inside the outermost perimeter of entire multiple heat radiator plates 13 with gap 14 therebetween. Thus, it is preferable that at least one upper-layer heat radiator plate 13D or 13E is provided to be laminated on multiple heat radiator plates 13.

Figure 9:
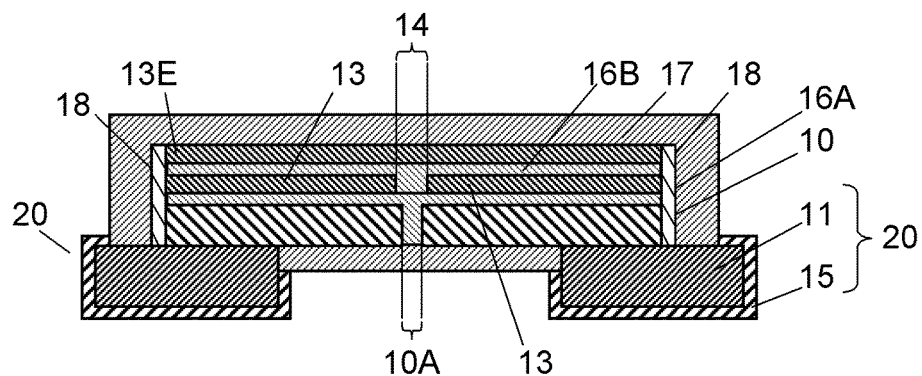
FIG. 9 is a sectional view of further another chip resistor according to the second embodiment of the present invention.

Further, as shown in FIG. 9, highly heat-conductive component 18 may be employed so as to thermally couple the pair of electrodes 20 with heat radiator plates 13, respectively, even if upper-layer heat radiator plate 13E is used. In FIG. 9, each of highly heat-conductive components 18 thermally couples upper-layer heat radiator plate 13E, heat radiator plate 13, and one of electrodes 20 with one another; however, highly heat-conductive component 18 may thermally couple only heat radiator plate 13 and electrodes 20 with each other.

Figure 10:
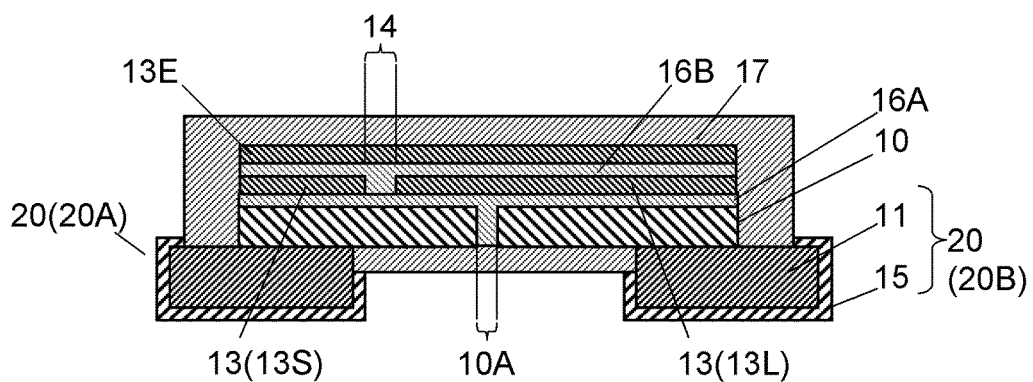
FIG. 10 is a sectional view of yet further another chip resistor according to the second embodiment of the present invention.

As shown in FIG. 10, gap 14 between heat radiator plates 13 do not need to be formed on the center line of resistive element 10. Specifically, first heat radiator plate 13S close to first electrode 20A may be different from second heat radiator plate 13L close to second electrode 20B in their length in the direction in which heat radiator plates 13 are disposed. In other words, gap 14 between first heat radiator plate 13S and second heat radiator plate 13L may be located at a position away from the center line of resistive element 10.

If the first heat radiator plate 13S close to negative first electrode 20A, from which a current flows out, is made shorter than second heat radiator plate 13L close to positive second electrode 20B, to which a current flows in, the temperature difference between electrodes 20 can be suppressed even if a temperature difference occurs between second electrode 20B and first electrode 20A due to the Peltier effect.

To dispose gaps 14 in a zigzag fashion, dimensions are determined so that parts projecting to and recessed from the opposite heat radiator plate 13 are alternately formed between upper-layer heat radiator plate 13D and its lower-layer heat radiator plate 13.

In FIG. 10, upper-layer heat radiator plate 13E is provided; however, without upper-layer heat radiator plate 13E as shown in FIG. 4, first heat radiator plate 13S and second heat radiator plate 13L may be used instead of first heat radiator plate 13A and second heat radiator plate 13B.

Third Exemplary Embodiment

Figure 11:
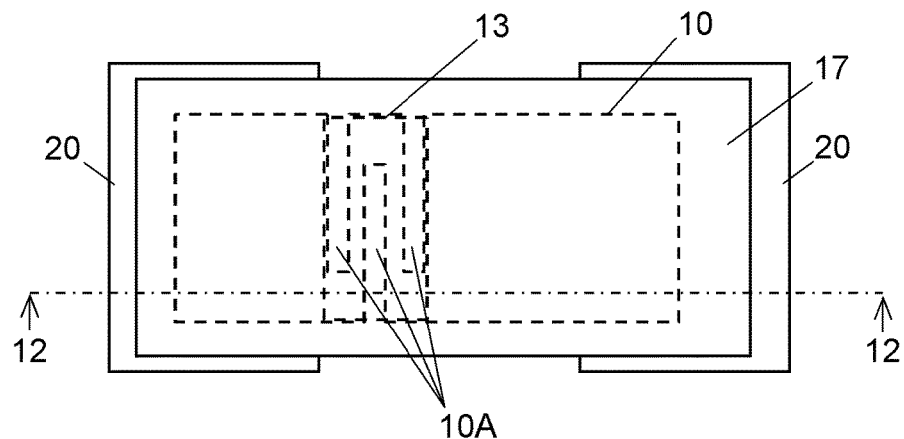
FIG. 11 is a plan view of a chip resistor according to a third exemplary embodiment of the present invention.
Figure 12:
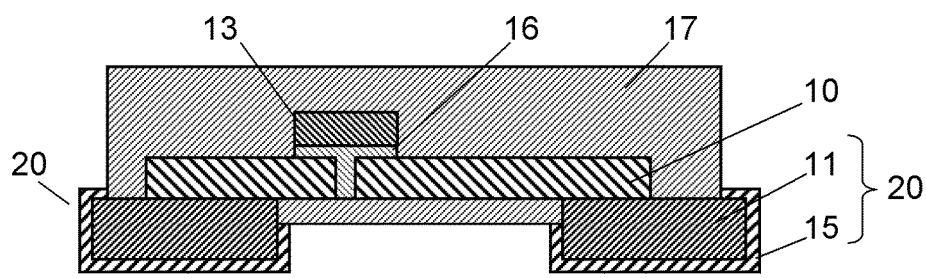
FIG. 12 is a sectional view of the chip resistor shown in FIG. 11.

FIGS. 11 and 12 are respectively a plan view and a sectional view taken along line 12-12, of a chip resistor according to the third exemplary embodiment of the present invention. This embodiment is different from the first embodiment in that one heat radiator plate 13 is disposed only at a position where trimming groove 10A is formed. That is, this chip resistor has resistive element 10, a pair of electrodes 20 formed on both ends of the first surface of resistive element 10, and heat radiator plate 13. Resistive element 10 is a plate-shaped metal and is provided with trimming groove 10A formed therein. Heat radiator plate 13 is fastened to the second surface of resistive element 10 and covers at least a part where trimming groove 10A is provided. The end of heat radiator plate 13 substantially agrees with the outer perimeter of the part where trimming groove 10A is provided in a planar view.

This configuration allows heat generated at a hot spot where trimming groove 10A is formed to be effectively transferred to heat radiator plate 13. This suppresses the temperature rise of resistive element 10 while reducing material costs.

INDUSTRIAL APPLICABILITY

A chip resistor according to the present invention has a high long-term reliability, and thus is useful as a chip resistor for high-power application used for detecting current values, for example, of various types of electronic devices.

The invention claimed is:
1. A chip resistor comprising:
   a resistive element of a plate-shaped metal;
   first and second electrodes formed at both ends of a first surface of the resistive element; and
   a plurality of heat radiator plates fastened to a second surface of the resistive element,
   wherein the plurality of heat radiator plates includes a first heat radiator plate closest to the first electrode and a second heat radiator plate closest to the second electrode and are disposed spaced apart from each other via a gap therebetween, and
   the second heat radiator plate has a heat conductivity different from a heat conductivity of the first heat radiator plate.
2. The chip resistor according to claim 1, further comprising an upper-layer heat radiator plate laminated on the first heat radiator plate and the second heat radiator plate.
3. The chip resistor according to claim 1, further comprising:
   a first upper-layer heat radiator plate laminated on the first heat radiator plate; and
   a second upper-layer heat radiator plate laminated on the second heat radiator plate and thermally coupled with the first upper-layer heat radiator plate.
4. The chip resistor according to claim 1,
   wherein the first electrode is thermally coupled with the first heat radiator plate, and
   wherein the second electrode is thermally coupled with the second heat radiator plate.
5. The chip resistor according to claim 1, wherein a gap between the first heat radiator plate and the second heat radiator plate is away from a center line of the resistive element.
6. The chip resistor according to claim 1, wherein each of the plurality of heat radiator plates has a roughened surface.
7. The chip resistor according to claim 1, wherein each of the plurality of heat radiator plates includes a ceramic plate having a first surface stuck onto the second surface of the resistive element and a second surface opposite to the first surface; and a metal layer provided on the second surface of the ceramic plate.
8. A chip resistor comprising:
   a resistive element of a plate-shaped metal and provided with a trimming groove;
   a pair of electrodes formed at both ends of a first surface of the resistive element; and
   a heat radiator plate fastened to a second surface of the resistive element and covering at least a part provided with the trimming groove, the heat radiator plate including a first heat radiator plate and a second heat radiator plate,
   wherein an end of the heat radiator plate agrees with an outer perimeter of the part provided with the trimming groove in a planar view, an adhesive layer is disposed between each of the first and second heat radiator plates and the resistive element in sectional view, the adhesive layer comes in direct contact with the first heat radiator plate and the second heat radiator plate and the resistive element, and the second heat radiator plate has a heat conductivity different from a heat conductivity of the first heat radiator plate.

* * * * *